United States Patent
Baur et al.

(10) Patent No.: US 9,115,981 B2
(45) Date of Patent: Aug. 25, 2015

(54) APPARATUS AND METHOD FOR INVESTIGATING AN OBJECT

(71) Applicant: Carl Zeiss SMS GmbH, Jena (DE)

(72) Inventors: Christof Baur, Germany (DE); Klaus Edinger, Lorsch (DE); Thorsten Hofmann, Rodgau (DE); Gabriel Baralia, Darmstadt (DE); Michael Budach, Hanau (DE)

(73) Assignee: Carl Zeiss SMS GmbH, Jena (DE)

( * ) Notice: Subject to any disclaimer, the term of this patent is extended or adjusted under 35 U.S.C. 154(b) by 0 days.

(21) Appl. No.: 14/038,148

(22) Filed: Sep. 26, 2013

(65) Prior Publication Data

US 2014/0027512 A1 Jan. 30, 2014

Related U.S. Application Data

(63) Continuation of application No. PCT/EP2012/002276, filed on May 25, 2012.

(60) Provisional application No. 61/491,713, filed on May 31, 2011.

(51) Int. Cl.
   *G06K 19/00* (2006.01)
   *G01B 15/00* (2006.01)
   *B82Y 35/00* (2011.01)
   (Continued)

(52) U.S. Cl.
   CPC ............... *G01B 15/00* (2013.01); *B82Y 35/00* (2013.01); *G01Q 30/02* (2013.01); *G06K 7/0004* (2013.01); *H01J 37/244* (2013.01); *H01J 37/28* (2013.01); *H01J 37/3045* (2013.01); *H01J 2237/2817* (2013.01); *H01J 2237/2818* (2013.01);
   (Continued)

(58) Field of Classification Search
   USPC .......................... 235/435, 439, 440
   See application file for complete search history.

(56) References Cited

U.S. PATENT DOCUMENTS

| 5,081,353 A | 1/1992 | Yamada et al. |
| 5,117,110 A | 5/1992 | Yasutake |
| 2008/0135750 A1 | 6/2008 | Kley |

FOREIGN PATENT DOCUMENTS

| EP | 2 023 372 | 2/2009 |
| JP | H3-40356 | 2/1991 |
| JP | 2009-148889 | 7/2009 |

OTHER PUBLICATIONS

International Search Report for corresponding PCT Appl. No. PCT/EP2012/002276, dated Aug. 1, 2012.

(Continued)

*Primary Examiner* — Matthew Mikels
(74) *Attorney, Agent, or Firm* — Fish & Richardson P.C.

(57) ABSTRACT

The present invention refers to an apparatus and a method for investigating an object with a scanning particle microscope and at least one scanning probe microscope with a probe, wherein the scanning particle microscope and the at least one scanning probe microscope are spaced with respect to each other in a common vacuum chamber so that a distance between the optical axis of the scanning particle microscope and the measuring point of the scanning probe microscope in the direction perpendicular to the optical axis of the scanning particle microscope is larger than the maximum field of view of both the scanning probe microscope and the scanning particle microscope, wherein the method comprises the step of determining the distance between the measuring point of the scanning probe microscope and the optical axis of the scanning particle microscope.

25 Claims, 6 Drawing Sheets

(51) Int. Cl.
  *G01Q 30/02* (2010.01)
  *H01J 37/244* (2006.01)
  *H01J 37/28* (2006.01)
  *H01J 37/304* (2006.01)
  *G06K 7/00* (2006.01)

(52) U.S. Cl.
  CPC ............. *H01J2237/2826* (2013.01); *H01J 2237/30444* (2013.01)

(56) References Cited

OTHER PUBLICATIONS

A. Emundts et al., "Combination of a Besocke-type scanning tunneling microscope with a scanning electron microscope", Rev. Sci. Instr., vol. 72, No. 9, p. 3546-3551 (2001).

A. Wiessner et al., "Design consideration and performance of a combined scanning tunneling and scanning electron microscope", Rev. Sci. Instr., vol. 68, No. 10, p. 3790-3798 (1997).

"Transparently combining SEM, TEM & FIBs with AFM / SPM & NSOM", Nanonics, Issue 2.3, Dec. 2002.

Gerber et al. "Scanning Tunneling Microscope Combined with a Scanning Electron Microscope", Rev. Sci. Instr., vol. 57, No. 2, p. 221-224 (1986).

Mick et al., "Combined nanorobotic AFM/SEM system as novel toolbox for automated hybrid analysis and manipulation of nanoscale objects." 2010 IEEE International Conf on Robotics and Automation, Anchorage, AK, May 2010, pp. 4088-4093.

Japanese Office Action, with translation thereof, for JP Appl No. 2014-513079, dated Feb. 13, 2015.

Fig. 3
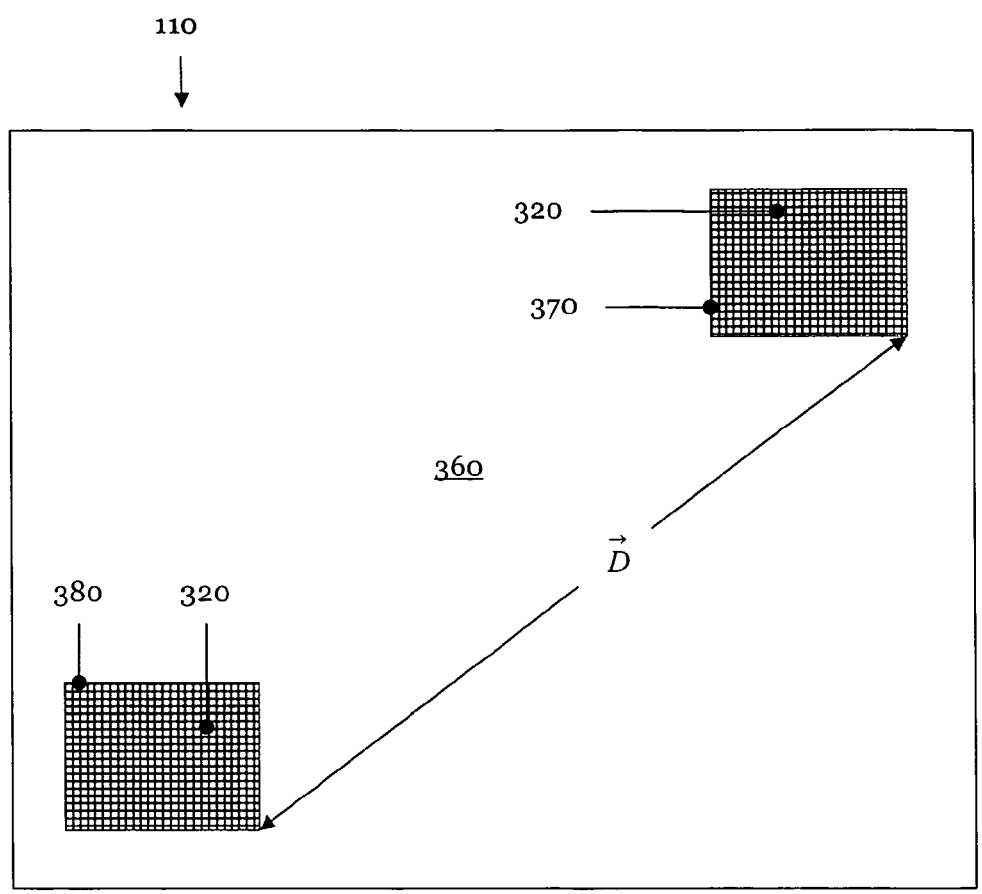
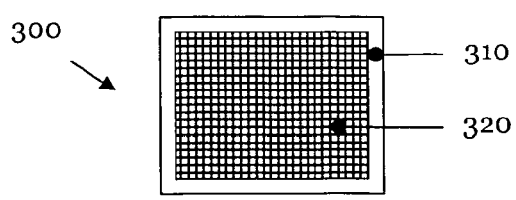

APPARATUS AND METHOD FOR INVESTIGATING AN OBJECT

1. TECHNICAL FIELD

The present invention refers to an apparatus and a method for investigating and/or for processing an object with a scanning particle microscope and a scanning probe microscope.

2. PRIOR ART

Progress in the field of nanotechnology enables the fabrication of devices having smaller and smaller structural elements. For the processing and the representation of nanostructures tools are required which are able to scan these structures in several dimensions so that an image can be generated from the measurement data.

In a scanning particle microscope, a particle beam interacts with a sample. Scanning particle microscopes are in the following abbreviated as SBM (Scanning particle Beam Microscope). For example, electrons and/or ions are used as particles. Other particle beams can also be uses. It is also possible to apply other particle beams. Electron beams or ion beams can be used to scan large areas of a sample with an adjustable resolution. Back-scattered electrons or secondary electrons which are released by locally impinging particles are measured with a detector. The signal of the detector is then used to generate an image of the sample surface. Furthermore, ions, electrons and/or photons generated by the impinging particles can be used in order to analyze the material composition of the sample at the surface and in various layers of the sample with different depths. Thus, scanning particle microscopes are powerful analysis tools in the nanotechnology.

However, the tools can only provide very limited topographical information of the sample surface in the direction of the particle beams. Nevertheless, it is in many application fields of the nanotechnology mandatory to precisely know height profiles of a sample surface.

On the other hand, scanning probe microscopes scan a sample or its surface with a test prod, and thus generate a realistic topography of the sample surface. In the following, a scanning probe microscope is abbreviated by SPM (for Scanning Probe Microscope). Various types of SPMs are differentiated by the kind of interaction between the test prod and the sample surface. Often scanning tunneling microscopes (STM) are used. In an STM, the sample and the test prod are not in contact with each other. Rather a variable voltage is applied to the STM and the resulting tunnel current is measured. Thus, the application of the STM is restricted to a conductive sample or to samples which have an electrically conductive surface layer.

The atomic force microscope (AFM) or the scanning force microscope (SFM) does not have this limitation with respect to the sample to be investigated. In this type of SPM, the probe or the test prod is deflected by atomic forces of the sample surface which are typically Van-der-Waals forces. The deflection of the test prod depends on the force acting between the probe and the sample surface. This force is used for determining the surface topography.

Besides these popular SPM types, there is a multitude of further SPM tools which are used for specific application fields as for example magnetic force microscopes (MFMs), optical and acoustical scanning near-field microscopes.

Scanning probe microscopes can scan a sample surface with a resolution up to the atomic range depending on the used test prod. However, the large resolution limits the application of these tools to very small sections of a sample. A change of the resolution of a SPM requires the exchange of its test prod which requires some effort. Moreover, it is a time consuming process to localize the section of the surface area to be investigated with the SPM.

Already some times ago these considerations have led to the idea to use both tools for the analysis of a sample in order to determine comprehensive information of the sample topography. However, the application of two separate tools wherein at least one comprises a vacuum chamber for the investigation of a single sample has a serious disadvantage. Apart from the above described difficulty at the detection of the section to be investigated with the SPM, it is necessary to remove the sample from the vacuum chamber of the scanning particle microscope which means that the vacuum has to be destroyed for each sample. This excludes an industrial application of two separate tools for the measurement of a sample surface.

For this reason, already more than 20 years ago, development efforts have been made in order to combine scanning particle microscopes and scanning probe microscopes in a single device as it is described for example by Ch. Gerber et al. in the article "Scanning Tunneling Microscope Combined with a Scanning Electron Microscope", Rev. Sci. Instr., vol. 57, No. 2, p. 221-224 (1986). In a simultaneous operation these tools shall simultaneously investigate one position of a sample in order to bring into effect the benefits of the respective tool and to avoid to a large extend the discussed drawbacks of each tool.

This development has been started from both sides. For example, the authors A. Emundts et al. describe in the article "Combination of a Besocke-type scanning tunneling microscope with a scanning electron microscope", Rev. Sci. Instr., Vol. 72, No. 9, p. 3546-3551 (2001) the insertion of an electron gun and a respective detector in a scanning tunneling microscope. The JP 2009 148 889 A discloses the insertion of an ion beam device in a force microscope. The authors A. Wiessner et al. exemplarily explain the subsequent insertion of a scanning tunnelling microscope in a scanning electron microscope in the article "Design consideration and performance of a combined scanning tunneling and scanning electron microscope", Rev. Sci. Instr., Vol. 68, No. 10, p. 3790-3798 (1997).

The Japanese application JP 2009 148 889 A discloses a combination of a focused ion beam (FIB) device and a force microscope. The sample stage of the combined tool has a tilting device which allows aligning the sample in the direction of both analysis systems.

When combining a scanning particle microscope and a scanning probe microscope several partially fundamental problems appear. Admittedly, a scanning particle microscope as well as a scanning probe microscope can analyze structures in the nanometer range; however, the tools themselves have macroscopic dimensions. Thus, a space problem inevitably occurs when combining both analysis tools in one vacuum chamber. Therefore, due to construction problems, often a trade-off is made with respect to the performance of both tools. For example, the number of detectors are limited which can be used for analyzing particles released by the particle beam of the scanning particle microscope from the sample.

Another important issue is the mutual interaction of the two analysis tools when they are simultaneously in operation. For example, the probe or the test prod of the probe can partially shadow the particle beam, and thus restrict its field of view. The article "Transparently combining SEM, TEM & FIBs with AFM/SPM & NSOM" in the product brochure Nanonics, Issue 2.3, December 2002 describes the application of specifically developed glass probes for the scanning probe microscope in order to reduce the shadowing effect with respect to the particle beam.

Moreover, the measurements of the two tools influence each other. When scanning the sample surface to be investigated, a test prod of a scanning probe microscope generally performs periodic vibrations around its equilibrium position. These vibrations are transmitted to the sample; whereby the resolution of the simultaneously impinging particle beam is reduced. On the other hand, the test prod which is close to the sample surface captures a portion of the electrons released by the particle beam from the sample. These electrons superimpose the measurement signal of the scanning probe microscope. This may limit the maximum usable electron current of the scanning particle microscope.

Finally, the two analysis tools have contradicting requirements with respect to the various components of the apparatus. It is beneficial for a scanning particle microscope if the sample stage is small and light as this allows a movement, a rotation or a tilting of the sample stage without applying large forces. However, a small sample stage limits the sample size. The sample size is also limited by the above-mentioned space problem. These restrictions are not tolerable for some samples—as for example for photomasks. On the other hand, the sample stage is supposed to have a large mass for a scanning probe microscope in order attenuate the vibrations of the SPM to a large extend, and thus do not limit the resolution of the SPM.

The present invention is therefore based on the problem to provide a method and an apparatus for analyzing a sample with a scanning particle microscope and a scanning probe microscope which at least partially avoid the above-mentioned drawbacks.

3. SUMMARY OF THE INVENTION

According to an embodiment of the present invention this problem is solved by a method for investigating an object with a scanning particle microscope and at least one scanning probe microscope with a probe. The scanning particle microscope and the at least one scanning probe microscope are spaced with respect to each other in a common vacuum chamber so that a distance between an optical axis of the scanning particle microscope and the measuring point of the scanning probe microscope in the direction perpendicular to the optical axis of the scanning particle microscope is larger than a maximum field of view of both the scanning probe microscope and the scanning particle microscope. The method comprises the determining the distance between the measuring point of the scanning probe microscope and the optical axis of the scanning particle microscope.

In an embodiment, a method for investigating an object comprising a scanning particle microscope and at least one scanning probe microscope with a probe, wherein the scanning particle microscope and the at least one scanning probe microscope are spaced with respect to each other in a common vacuum chamber so that a distance between an optical axis of the scanning particle microscope and a measuring point of the scanning probe microscope in a direction perpendicular to the optical axis of the scanning particle microscope is larger than the maximum field of view of the scanning probe microscope as well as of the scanning particle microscope, wherein the method comprises the step of determining the distance between the measuring point of the scanning probe microscope and the optical axis of the scanning particle microscope.

The present invention combines the scanning particle microscope and the scanning probe microscope in a vacuum chamber. However, the inventive method gives up the requirement that the SBM and the SPM simultaneously investigate the sample at the same location. In this way, the present invention solves the space problem by combining the SBM and the SPM in a single apparatus within the vacuum chamber of the apparatus. Thus, more degree of freedom is achieved at the configuration of the SBM and the SPM. As the trade-off between the space and the function of the analyzing tools is lifted; the SBM and the SPM do no longer mutually limit their respective performance. In particular, the spatial separation of the two analyzing tools enables the investigation of samples having a large area as for example photomasks. In addition, the powerful spectroscopic operation modes of a scanning particle microscope—as for example energy dispersive X ray (EDX) spectroscopy can be used for analyzing sample surfaces.

By spatially and temporally separating the measurements of the scanning particle microscope and the scanning probe microscope, the mutual influence of the measurement of the SBM and the SPM is eliminated. This improves the quality of the images generated from the measurement data.

The spatial separation of the operating areas of the scanning particle microscope and the scanning probe microscope further allows locally introducing one or several processor gases in the working area of the scanning particle microscope, i.e. at the first measuring point. Thus, apart from analyzing the sample, the scanning particle microscope can additionally be used for a local modification of the sample via a chemical process induced by the particle beam. In this way, the inventive method allows a local removal of material in a controlled manner by using local etching induced by a particle beam. Furthermore, it is also possible to locally deposit material on the sample by the application of one or several suitable precursor gases.

The term "distance" means in this application a two-dimensional vector. It is in detail defined in the following fifth section.

In another embodiment, the method comprises automatically determining the distance between the measuring point of the scanning probe microscope and the optical axis of the scanning particle microscope when the probe of the scanning probe microscope has been exchanged.

In a further embodiment, an exchange mask can be used for an exchange of the probe, wherein the exchange mask additionally comprises one or several exchange probes and a locater chip having a structure which simultaneously covers at least partially a respective measuring area of the scanning probe microscope and a field of view of the scanning particle microscope.

In a further embodiment, the locater chip additionally has mechanical and electrical components managing an exchange of the probe.

In a further embodiment, the method for determining a distance between a first measuring point of a scanning particle microscope and at least one second measuring point of at least one scanning probe microscope comprises the following steps: (a) investigating at least a part of a structure of a locater chip at the first measuring point of the scanning particle microscope; (b) shifting the locater chip relative to the first measuring point by a nominal distance between the first measuring point and the second measuring point; (c) investigating the locater chip at the second measuring point with the scanning probe microscope; and (d) determining an actual distance between the first measuring point and the second measuring point via the results of at least the steps a. and c.

The described method comprises a method which allows to simply and reproducibly move the sample back and forth between the first measuring point at which the particle beam locally interacts with an area of the sample surface to be investigated and the second measuring point at which the test prod of the SPM locally interacts with the area of the sample surface to be investigated. The locator chip preferably acts in this process as a two-dimensional measurement standard which is used to calibrate the distance between the first measuring point and the second measuring point.

A further aspect comprises (a) determining the actual distance via the investigation results of the steps a. and c. if the locator chip is larger than the distance between the first measuring point and the second measuring point, and/or determining the actual distance via the investigation results of the steps a. to c. if the locator chip is smaller than the distance between the first and the second measuring points.

In the first case, the measurement of the distance between the first measuring point and the second measuring point is carried out by investigating the structure of the locator chip at the first measuring point with the SBM and at the second measuring point with the SPM. In the second case, the nominal distance is additionally required by which the locator chip is shifted when shifting the sample stage between the first and the second measuring point. Alternatively, the SBM and the SPM are jointly shifted by the nominal distance relative to the sample. Moreover, a portion of the nominal distance can be achieved by a movement of the sample stage and the complimentary portion can be achieved by a joint shift of the SBM and the SPM.

According to a further aspect, the locator chip comprises a micro-structured cell mesh which can be measured by the scanning particle microscope and the scanning probe microscope.

This feature secures that information coded in the surface structure can be scanned by both the SBM and the SPM.

In a further aspect, the first measuring point defines the area on the locator chip on which the particle beam of the scanning particle microscope impinges on the locator chip and the second measuring point defines the area of the locator chip with which the test prod of the scanning probe microscope interacts.

In another aspect, determining the actual distance between the first measuring point and the second measuring point comprises at least determining a code of a first cell by the scanning particle microscope and determining the code of a second cell by the scanning probe microscope.

A further aspect comprises (a) determining the actual distance between the first measuring point and the second measuring point by determining a code of a first cell by the scanning particle microscope and by determining the code of a second cell by the scanning probe microscope if the locator chip is larger than the distance between the first measuring point and the second measuring point, and/or (b) determining the actual distance between the first measuring point and the second measuring point by determining a code of a first cell by the scanning particle microscope, by determining the code of a second cell by the scanning probe microscope, and using the nominal distance if the locator chip is smaller than the distance between the first measuring point and the second measuring point.

If the locator chip is larger than the distance between the point of impingement of the particle beam of the SBM on the locator chip (first measuring point) and the test prod of the SPM (second measuring point), the measurement of the distance is carried out by analyzing and evaluating the data coded on the surface of the locator chip at the measuring points. Thereby, it is not necessary that data are coded across the entire surface of the locator chip. Rather, it is sufficient if the locator chip comprises two coded areas which comprise the distances between the point of impact of the particle beam and all test prods of the SPM. In the second case, if the dimensions of the locator chip are smaller than the distance between the first and the second measuring points, apart from the data coded in the locator chip, the shift between the nominal distance between the first measuring point and the second measuring point is additionally required. The sample stage executes the shift by the nominal distance between the first measuring point and the second measuring point in order to measure the distance between the point of impingement of the particle beam of the SBM on the locator chip and the interaction area of the test prod of the SPM with the locator chip.

In a further aspect, determining the distance between the first measurement point and the second measurement point is automatically carried out in regular intervals.

In the course of an analysis process the distance between the SBM and the SPM may change, for example because of a thermal drift. The described method can be repeated regularly and/or unregularly in order to guarantee that the SBM and the SPM analyze the same area of the sample surface. In order to repeat the inventive method, the locator chip is arranged on the sample stage instead of the sample. The exchange between the locator chip and the sample can be carried out automatically, manually and/or semiautomatically.

In still a further aspect determining the distance between the first measuring point and the second measuring point is automatically carried out after an exchange of a test prod.

The SPM can comprise several test prods in order to adapt the resolution of the SPM to the area of the sample surface to be investigated. Here, the exchange of a probe can be linked with measuring the distance of the new test prod with respect to the point of impingement of the particle beam. Thus, the application of the inventive method can be automated.

In another aspect, a locator chip for determining a distance between a first measuring point of a scanning particle microscope and at least one second measuring point of at least one scanning probe microscope comprises a cell mesh having a micro-structured surface structure in which information is coded which is determined by the scanning particle microscope and at least one scanning probe microscope.

An essential feature of the locator chip is its information coded in the surface which can be measured by both the SBM and the SPM. Thus, the locator chip can be used as a calibration standard for the determination of the distance between the first measuring point and the second measuring point by the two analysis tools.

According to a further aspect, at least a portion of the cells of the cell mesh comprises coordinates of the respective cell of the cell mesh which are coded in the micro-structured surface structure.

Apart from typical marks for characterizing a cell of the cell mesh at least a portion of the cells has coordinates which indicate in two dimensions the distance of the cell from a reference point on the locator chip. In this way, the locator chip becomes a two-dimensional measurement standard which can be "read" by both the SBM and the SPM.

According to a further aspect, the coordinates of the cells are numerically coded.

By numerically coding the coordinates of a cell, the images of the coordinates of the cells generated by the SBM and the SPM can directly be read, i.e. without using any technical mechanism. Apart from a numerical coding, the coordinates can also be indicated in another kind as for example by an alphanumeric code or by a barcode.

According to another aspect, the size of a cell of the cell mesh is smaller than an image field of the scanning particle microscope and the scanning probe microscope.

This secures that both the SBM and the SPM can scan the information stored in a cell so that a subsequent evaluation unit can analyze this information and display the information. Generally, the image field or the field of view of the SPM is smaller than the image field or field of view of an SBM so that the image field of the SPM determines the cell size. The larger the size of a cell, i.e. the higher the portion is within the field of view of the SPM, the higher is the effort to scan or to read out the cell by the SPM and respectively by the SBM. On the other hand, more information can be coded in a large cell than in a small cell. In particular, in a large cell the dimensions of the individual structural elements can be chosen to be large so that they can be scanned with a SBM and SPM with low resolution.

In still another aspect, the size of a cell of the cell mesh is smaller than 10 µm, preferably smaller than 5 µm, and most preferred smaller than 3 µm.

In a further preferred aspect, the smallest dimension of a structural element of a cell of the cell mesh is not smaller than 500 nm, preferably not smaller than 300 nm, and most preferred not smaller than 100 nm.

Elements with the indicated dimensions can easily be manufactured by micro-structuring. Structural elements having these minimal dimensions can also be scanned with scanning particle microscopes and scanning probe microscopes having a mid-range resolution. The indicated cell sizes are a trade-off between the effort for scanning a cell and the information to be coded in a cell, on the one hand, and on the other hand of the effort to scan and read out the information stored in the cell. Moreover, locator chips can be fabricated with a limited effort having cells with dimensions in the one-digit or low two-digit micrometer range whose cell mesh covers a larger area which is visible for the naked eye.

In still a further aspect determining the nominal distance between the first measuring point and the second measuring point comprises at least determining a code of a first cell by the scanning particle microscope, and determining the code of a second cell by the scanning probe microscope.

A further aspect comprises (a) determining the actual distance between the first measuring point and the second measuring point by determining a code of a first cell by the scanning particle microscope and by determining the code of a second cell by the scanning probe microscope if the locator chips is larger than the distance between the first measuring point and the second measuring point and/or (b) determining the distance between the first measuring point and the second measuring point by determining a code of a first cell by the scanning particle microscope, by determining the code of a second cell by the scanning probe microscope, and using of the nominal distance if the locator chip is smaller than the distance between the first measuring point and the second measuring point.

By reading out the local information stored in the code of the first cell and the code of the second cell, the respective location can be determined for this cell with respect to a reference point of the locator chip. In the simplest case, the distance between the first measuring point of the SBM and the second measuring point of the SPM is directly obtained from this information. If the locator chip is smaller than the distance between the first measuring point and the second measuring point, the distance is additionally required by which the sample stage has shifted the locator chip between the examination of the first measuring point and the examination of the second measuring point.

In another aspect, a cell comprises a reference point, a barcode for identifying a first coordinate, a barcode for identifying a second coordinate and/or the specification of the first and the second coordinate.

By the specification of these four elements each cell of a two-dimensional cell mesh is completely characterized. The reference point is the point of reference for the respective cell, the barcodes of the two coordinates indicate the orientation of the cell with respect to the reference point of the locator chip, and the numerical values of the coordinates denote the distance of the reference point of the cell to the reference point of the locator chip. The numerical values of the coordinates are indicated in a predetermined arrangement.

In still another aspect, the cell mesh comprises rectangular cells which are periodically arranged, and the reference point comprises an initial identifier, the first coordinate comprises an x-axis and the second coordinate comprises a y-axis.

In the simplest case, the individual cells of a cell mesh are squares and are periodically arranged in both the x-direction and the y-direction. However, it is neither necessary that the cells are rectangular nor that the coordinates are Cartesian coordinates. To fix the location of a cell on the locator chip, for example, polar coordinates can also be used; in particular if a variation of the spatial resolution across the locator chip is desired or demanded. The individual cells have not to be rectangular, arbitrary polygons or round cells can also be used. Moreover, Cartesian coordinates can be used which do not have a linear sub-division.

According to another aspect, the locator chip comprises a semiconductor chip, in particular a silicon chip.

Semiconductor materials have the advantage that a comprehensive arsenal for their micro-structuring is available. Apart from a micro-structured semiconductor, it is also possible to use a semiconductor substrate on which a micro-structured layer is arranged made of another material. Thus, apart from topography contrast, the SBM signal additionally comprises a material contrast. Therefore, the quality of the generated SBM image is enhanced. Furthermore, apart from semiconductor materials, other materials or material combinations can be used. For example, glass substrates or fused silica substrates can also be used which have on one surface a respective micro-structuring for example made of a metal or a metal alloy.

In a further aspect, a microscope system with a scanning particle microscope and at least one scanning probe microscope comprises a locator chip having one of the above indicated features for determining a distance between a first measuring point of the scanning particle microscope on the locator chip, and a second measuring point of the scanning probe microscope on the locator chip.

As already explained above, the application of a locator chip in a microscope system having spatially separated from each other a scanning microscope and a scanning probe microscope allows determining the distance between the interaction areas of the two analysis tools with a sample surface in a simple way.

According to still another aspect, the scanning particle microscope does not simultaneously operate with the scanning probe microscope.

Thus, it is prevented that the measurements of the two tools can mutually influence each other.

In still another aspect, the microscope system comprises a vacuum compatible scanning probe microscope. According to a further aspect, the scanning probe microscope is adapted to be adjustable between a parking position and a working position. The parking position is an inoperative state at which the test prod of the scanning probe microscope is not in operation. According to still another aspect, the microscope system comprises two scanning probe microscopes which are arranged on opposite sides of the scanning particle microscope.

Further beneficial embodiments of the invention are defined in further dependent claims.

4. DESCRIPTION OF THE DRAWINGS

In the following detailed description presently preferred embodiments of the invention are described with reference to the figures, wherein FIG. 1 shows a schematic representation of some important components of a microscope system including a first measuring point of a scanning particle microscope and a second measuring point of a scanning probe microscope;

FIG. 3 represents a schematic representation of two examples of a locator chip;

Figure 4:
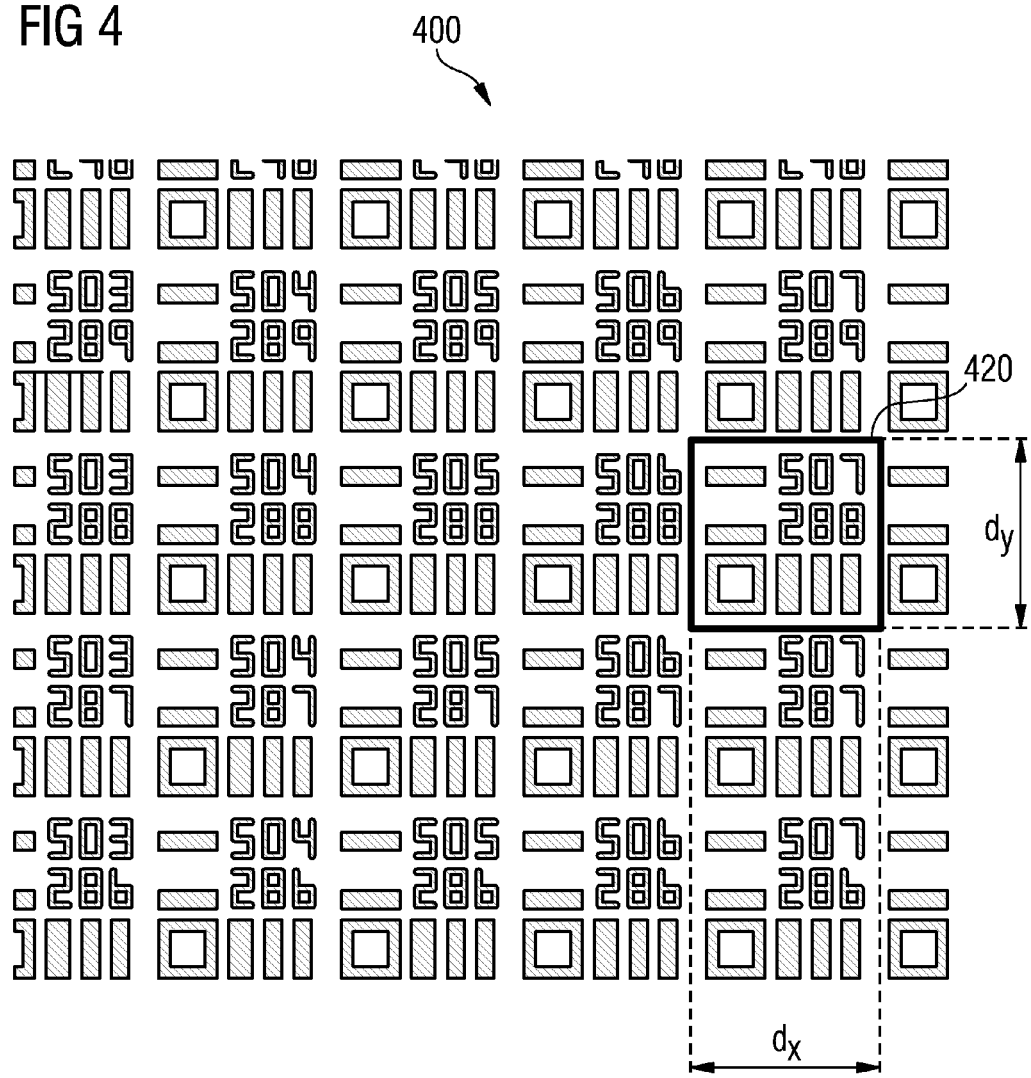
Figure 5:
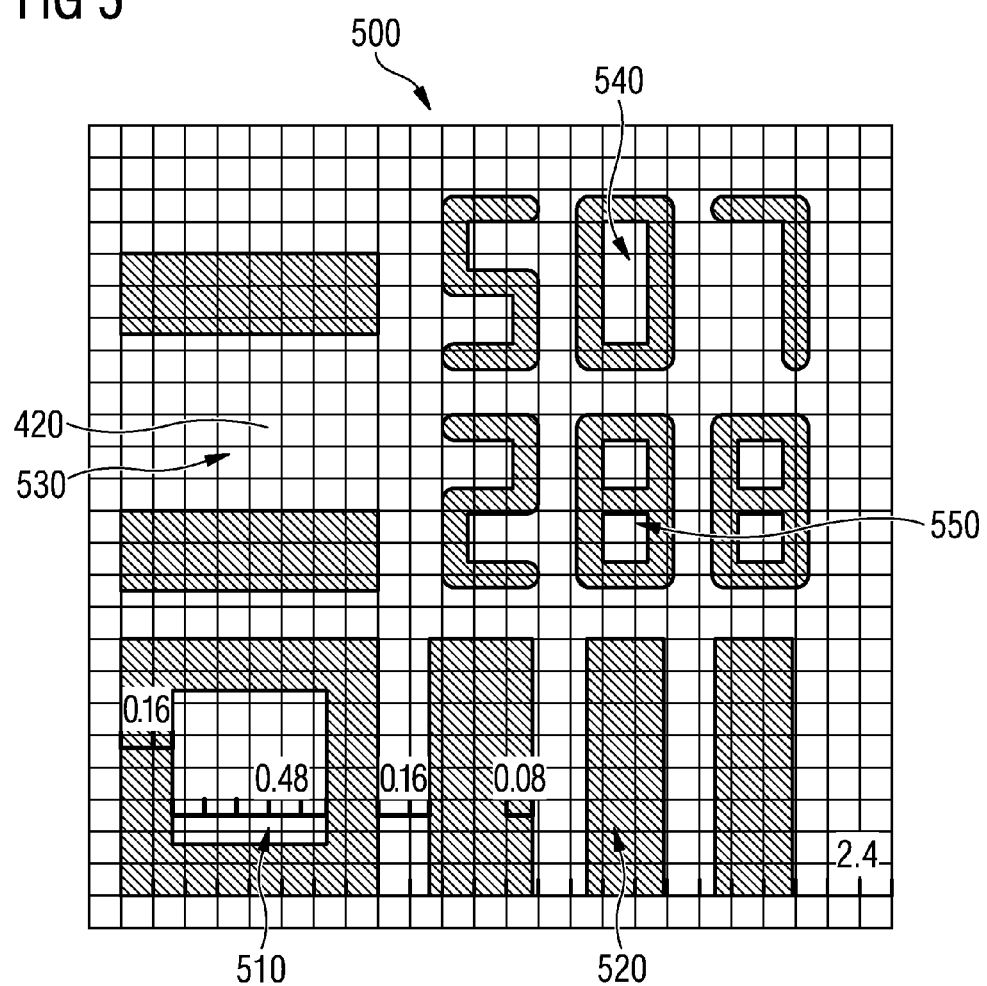
Figure 6:
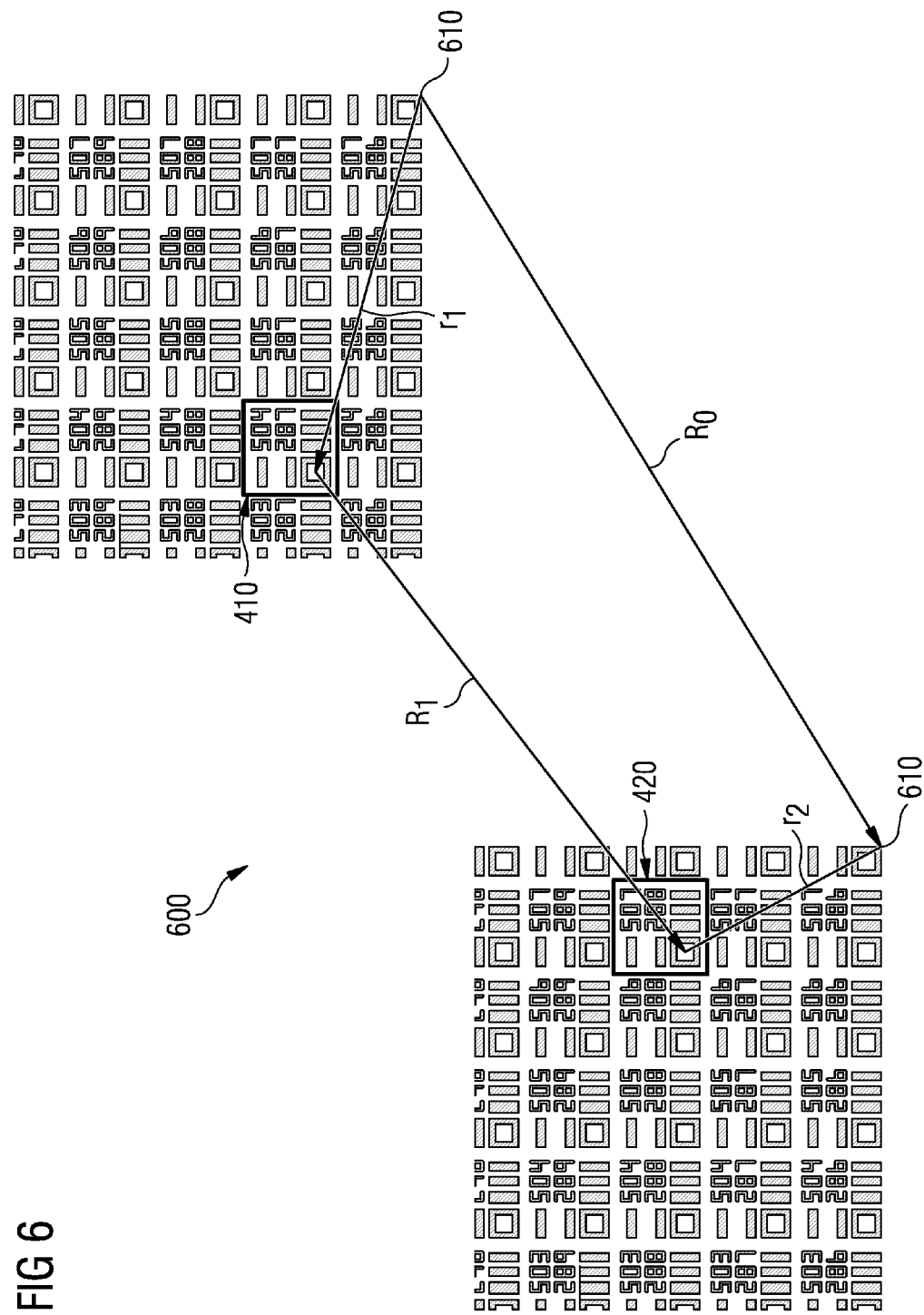

FIG. 4 schematically illustrates an enlarged section of the locator chip of FIG. 3;

FIG. 5 schematically represents a strongly magnified cell of the cell mesh of the locator chips of FIGS. 3 and 4; and FIG. 6 schematically illustrates the determination of the distance between the first measuring point of the scanning particle microscope and the second measuring point of the scanning probe microscope for the case that the locator chip is smaller than the distance between the two measuring points.

5. DETAILED DESCRIPTION OF PREFERRED EMBODIMENTS

In the following, presently preferred embodiments of an inventive apparatus and an inventive method are explained in more detail.

Figure 1:
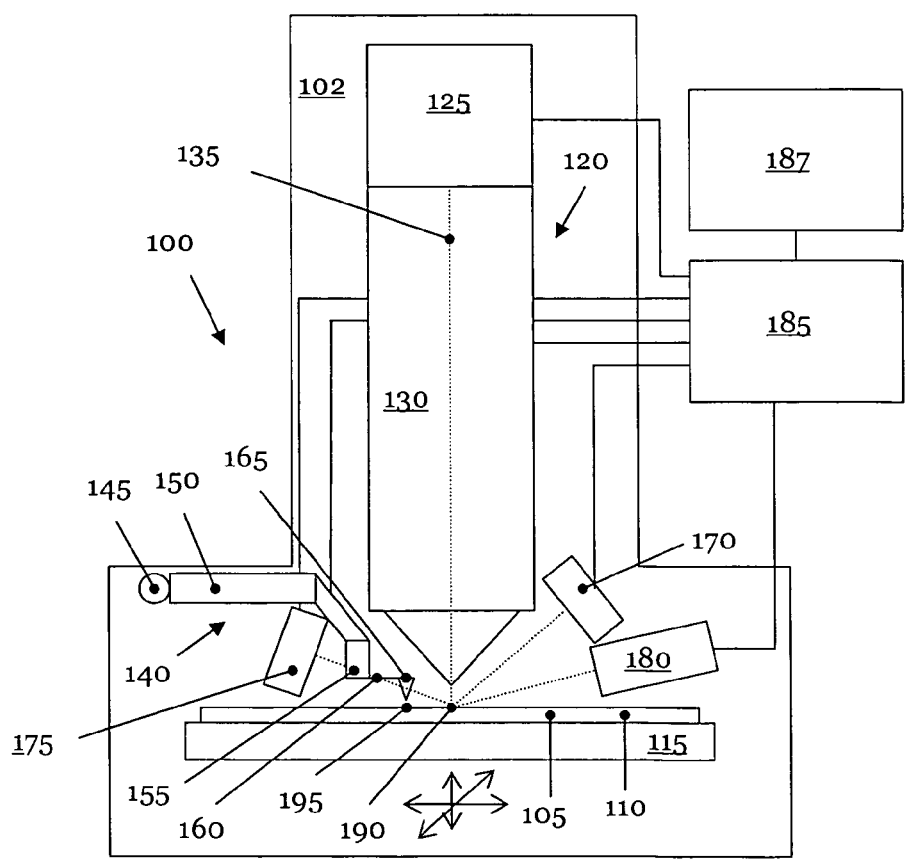

FIG. 1 schematically shows some components of a microscope system 100 having a scanning particle system 120 and a scanning probe system 140 which are arranged next to each other in a vacuum chamber 102. The scanning particle microscope 120 comprises a particle gun 125 and a column 130. The particle gun 125 generates a particle beam 135 and the column 130 focuses the particle beam 135 and directs it to a sample 105 or to the locator chip 110.

The sample 105 or the locator chip 110 is arranged on a sample stage 115. The sample stage 115 can be moved in three directions relative to the SBM (Scanning particle Beam Microscope) 120 and the SPM (Scanning Probe Microscope) 140 as it is illustrated by the crossed arrows in FIG. 1. In an alternative example, the sample stage 115 is fixed and the SBM 120 and the SPM 140 are jointly moved relative to the sample stage 115. It is further possible to arbitrarily distribute the relative movement between the analysis tools 120 and 140 and the sample stage 115. For example, the example stage 115 can be moveable in a plane perpendicular to the particle beam 135 and the SBM 120 and the SPM 140 can be shiftable in the beam direction. One or several micro-manipulators can perform the movement (not shown in FIG. 1). Moreover, it is also possible to equip both the sample stage 115 and the analysis tools 120 and 140 with three dimensional movement abilities. Additionally, the sample stage may have a tilting capability and can for example have a Goniometer.

The particle beam 135 impinges at the first measuring point 190 on the sample 105 or on the locator chip 110. Preferably, the particle beam 135 impinges on the sample 105 or the locator chip 110 essentially in the same height. The term "essentially" means here as well as on other positions in the description, a specification of a numerical value which is within the measuring limit of the respective quantity.

The sample 105 can be an arbitrary micro-structured component or any element. For example, the sample 105 can comprise a transmissive or a reflective photomask and/or a template for the nano-imprint technique. Furthermore, the microscope system 100 can for example be used for investigating an integrated circuit, a micro-electromechanical system (MEMS) and/or of a photonic integrated circuit (PIC).

In the example illustrated in FIG. 1, the SBM 120 of the microscope system 100 comprises a scanning electron microscope (SEM). When using an electron beam as the particle beam 135 the damages caused by the electron beam at the sample 105 or at the locator chip 110 are relatively small compared to an ion beam.

As it is indicated in FIG. 1, the working distance between the electron gun 130 and the probe 105 or the locator chip 110 is low. Thus, the electron beam can be focused at the first measuring point 190 to a spot having a diameter of less than 10 nm.

For a thin locator chip 110 which is at least in partial areas transmissive and for a suitable sample 105, a scanning transmission electron microscope (STEM) can be used instead of a scanning electron microscope in the microscope system 100. Furthermore, the SBM 120 can operate with an ion beam instead of electrons, i.e. the SBM 120 comprises in this case an FIB (Focused Ion Beam) device. Moreover, the SBM 120 can use photons having a short wavelength for the investigation of a sample 105 and/or the locator chip 110. In this process, the wavelength of the applied photons has to be so small that the image generated by the photons can resolve structures in the nanometer range.

In the example presented in FIG. 1, the scanning probe microscope (SPM) 140 is a force microscope (AFM, Atomic Force Microscope). A scanning tunneling microscope can (STM) be used instead of an AFM. Apart from the tunnel current (STM) and the Vander-Waals forces (force microscope) many further physical quantities can be used for the investigation of a sample 105. For example, a magnetic force microscope (MFM) exploits the magnetic interaction between the sample 105 and the probe or its test prod. An optical scanning near-field microscope uses photons for the investigation of the sample. This listing of various SPM types is only exemplary and by no means complete. However, all these SPM types have in common that there probes are optimized for the respective interaction with the sample 105.

The SPM 140 is fixed to a rotary joint 145 at the support of the electron gun 130 (not represented in FIG. 1). The rotary joint 145 brings the SPM from a parking position (not shown in FIG. 1) to a working position. Moreover, the rotary joint 145 brings the SPM 140 in a position for exchanging the probe.

A support 150 brings the measuring head of the SPM 140 close to the first measuring point 190 at which the electron beam 135 impinges on the sample 105 or on the locator chip 110. Furthermore, the support 150 can comprise one or several micro-manipulators (not represented in FIG. 1) in order to adapt the position of the SPM 140 to the sample 105 to be investigated.

The upper end of a piezo actuator 155 of the SPM 140 is connected with the support 150. The other end of the piezo actuator 155 carries the probe of the SPM 140. The probe comprises a lever arm 160 which is in the following called cantilever 160, as it is usual in the subject area. The cantilever 160 carries a test prod 165. The test prod 165 interacts at the second measuring point 195 with the sample 105 or the locator chip 110.

A control member can be arranged on the cantilever 160 of the SPM 140, for example on its upper side (not shown in FIG. 1). The control element enables to bring the cantilever 160 from a parking position in a working position and vice-versa by applying a respective control signal via the computer system 185. For example, the control member can be a piezo actuator or a bimetal element. The bimetal element bends the cantilever 160 in a defined manner in a predetermined direction due to the heat generated from electrical energy. However, the control member can also be designed as an analog element so that it can generate vibrations in the cantilever 160, for example at its resonance frequency.

Furthermore, the cantilever 160 can have a sensor element (not presented in FIG. 1) which measures the deflection of the cantilever 160. The signal of the sensor element is transmitted to the computer system 185. The computer system 185 can output a respective corrective signal to the piezo actuator 160. Thus, the piezo actuator 160 of the SPM 140 can operate in a closed loop. Furthermore, the computer system 185 can further output a signal to the piezo actuator 160 so that the piezo actuator 160 scans the sample 105 or the locator chip 110 in order to determine a two-dimensional or a three-dimensional contour of the surface of the sample 105 or of the locator chip 110.

A detector 170 converts the secondary electrons generated by the electron beam 135 at the first measuring point 190 and/or the electrons back-scattered from the sample 105 in an electrical measurement signal and forwards the electrical measurement signal to the computer system 185. The detector 170 can have a filter or a filter system in order to discriminate the electrons with respect to their energy and/or the solid angle (not presented in FIG. 1).

The spatial separation of the working area of the SBM 120 (first measuring point 190) which is in the example of FIG. 1 an SEM, and the working area of the SPM 140 (second measuring point 195) makes room for the insertion of a second detector 175. The microscope system 100 additionally having the detector 175 can also detect photons which are generated in the sample 105 or the locator chip 110 by the impinging electron beam 135 at the first measuring point 190. For example, the detector 175 can spectrally resolve the energy spectrum of the generated photons, and thus can lead to conclusions about the composition of the surface of the sample 105, or of layers of the sample 105 which are close to the surface. A more comprehensive image of the sample 105 or of its material composition is revealed by combining the information contained in the detected electrons and the detected photons compared to the measurement signal of a single detector 170 or 175.

Moreover, the microscope system 100 comprises an ion source 180 which provides ions of low energy to the area of the first measuring point 190 in case that the sample 105 is electrically isolating or has an electrical isolating surface layer. The ions decrease an electrical charging of the surface of the sample 105 or of the locator chip 110 by the electron beam 135, and thus avoid a reduction of the spatial resolution of the impinging electron beam 135.

The computer system 185 can comprise an evaluation unit which analyses the measurement signals of the detectors 170 and 175 and generates an image therefrom which is displayed on the display 187. The evaluation unit also processes the measurement signal of the SPM 140 and graphically represents this signal on the display 187. The computer system 185 can control the electron gun 125 and the column 130 of the SEM 120. In addition, the computer system 185 can control the SPM 140. The computer system 185 can scan the piezo actuator 160 in the x- and/or the y-direction across the sample 105 or the locator chip 110 by applying electrical signals to the connections of the piezo actuator 160.

The computer system 185 can comprise a microprocessor, a CPU, a PC and/or a workstation. It can be integrated in the microscope system 100 or it can be a stand-alone tool. Furthermore, the computer system 185 can comprise input/output devices as for example a keypad, by mouse and/or a printer. The computer system 185 can comprise an evaluation unit which comprises algorithms in order to generate image data from the measurement signals of the SPM 140 and the detectors 170 and/or 175. Furthermore, the computer system 185 comprises a monitor or a display 187 to present the image data generated by the evaluation unit. The computer system 185 can be implemented in hardware, software, Firmware or a combination thereof.

The microscope system 100 comprises one or several pump systems in order to generate a vacuum in the vacuum chamber 102 and to maintain the vacuum (not depicted in FIG. 1).

Further, the microscope system 100 can comprise one or several gas containers in combination with respective valves and a gas-delivery system (also not shown in FIG. 1). Thus, a chemical reaction can locally be induced by the effect of the electron beam 135 and of a process gas such that the sample 105 can specifically be modified by a local material removal or a local material deposition. Moreover, it may be beneficial to additionally install a suction device close to the first measuring point 190 (also not illustrated in FIG. 1) in order to exhaust waste products generated by the chemical reaction induced by the electron beam 135 from the reaction zone, so that the waste products cannot contaminate the vacuum chamber 102.

Figure 2:
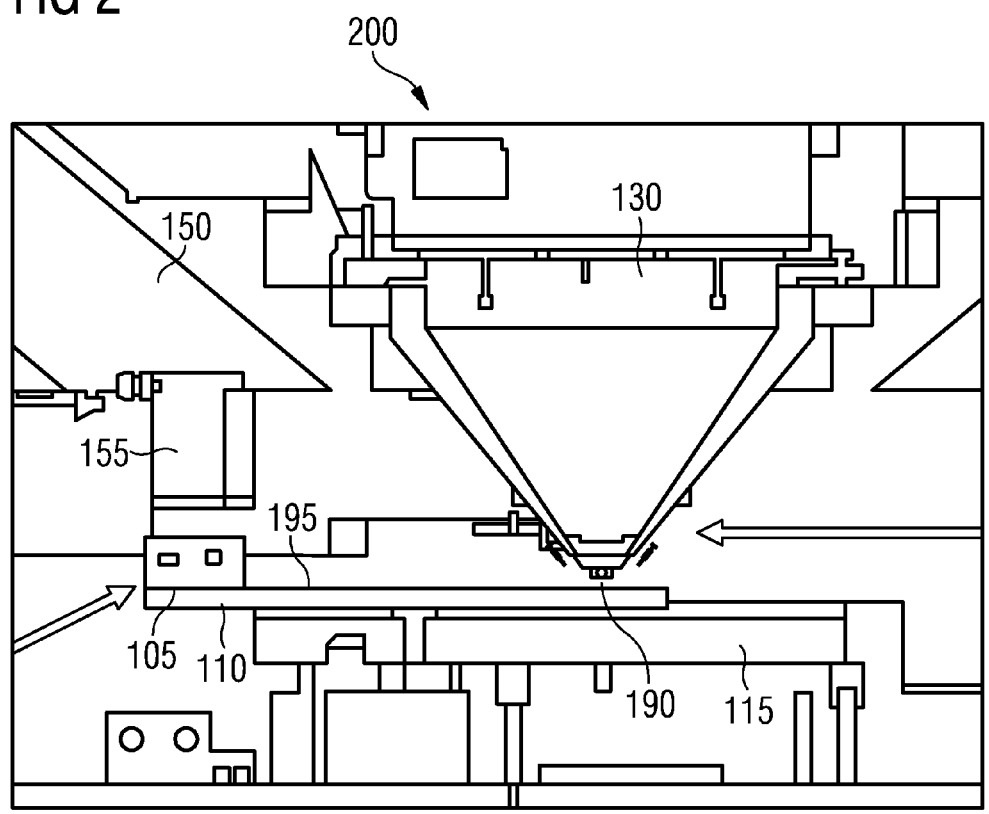
FIG. 2 shows a cut-out of the microscope system of FIG. 1 around the area of the two measuring points.

FIG. 2 shows an enlarged section of an area of the sample 105 or the locator chip 110 around the first measuring point 190 and the second measuring point 195 of the microscope system 100 of FIG. 1. The sample 105 or the locator chip 110 are arranged on the sample stage 150 analog to the microscope system 100 of FIG. 1. Similar to FIG. 1, the SBM 120 of FIG. 2 is a SEM. The electrons of the electron beam 135 impinge on the sample 105 or the locator chip 110 at the first measuring point 190. As already mentioned during the discussion of FIG. 1, the column 130 of the SEM 120 has a small distance to the sample 105 or to the locator chip 110. Thus, the electron beam 135 can be focused to a small diameter at the first measuring point 190. The upper end of the piezo actuator 155 of the SPM 140 is attached to the support 150. The cantilever 160 and the test prod 165 are not represented in FIG. 2. The test prod 165 interacts with the sample 105 or the locator chip 110 at the second measuring point 195 as described above.

The beam diameter of the electron beam 135 is adjustable at the sample surface via the parameters of the electron beam 135, and thus the size of the first measuring point 190 can be changed. The minimum size depends on the maximum resolution of the SEM 120. The maximum resolution is a function of the working distance between the focusing unit in the column 130 of the SEM 120 and the surface of the sample 105 or the locator chip 110. The working distance of the SEM 120 can be reduced by the spatial separation of the SEM 120 and the SPM 140, so that the electron beam 135 of the SEM 120 can be concentrated in its focus to a small diameter (<10 nm).

FIG. 3 illustrates in the upper partial image a top view of the locator chip 110 of FIGS. 1 and 2. The lower partial image shows a top view of an exemplary second locator chip 300.

The locator chip 300 has dimensions in the range of some millimeters. Except for an all-round edge 310 the area of the locator chip 300 is covered with a cell mesh 320. The edge 310 which is free from cells secures a simple handling of the locator chip 300.

The locator chip 110 in the upper partial image of FIG. 3 has an overall area which is comparable to the area of the sample 105, i.e. its dimension covers the one-digit centimeter range. In order to keep the manufacturing effort for the locator chip 110 low, only two sections 370 and 380 have the cell mesh 320 of the locator-chip 300. These sections are separated by a distance vector $\vec{D}$ from each other. In the example of FIG. 3 the distance vector $\vec{D}$ has two components, as for example (x, y). However, the larger part 360 of the area of the locator chip 110 does not have a micro-structure. On the other hand, it is also possible to cover the entire area of the locator chip 110 with a cell mesh 320 apart from an edge region, similar to the locator-chip 300 represented in the lower partial image of FIG. 3.

The locator chip 110, 300 can comprise a silicon chip. For example, a locator chip 110, 300 made of silicon may be fabricated by depositing a photoresist on a silicon wafer. Then an electron beam can be used write a predetermined structure or an arrangement of predetermined structural elements in the photoresist. After developing of the photoresist and etching the silicon wafer, the surface of the silicon wafer comprises the structural elements in the form of grooves.

Furthermore, any other semiconductor material may be used for the fabrication of a locator chip 110, 300. Moreover, glass or fused silica substrates can be used as starting material for the fabrication of the locator chips 110, 300. Moreover, as already discussed in the context of the sample 105, it is beneficial if the surface of the locator chip 110, 300 is not electrically isolating. This characteristics avoids a reduction of the resolution of a charged particle beam of the SBM 120 by a charging of the locator chip surface.

FIG. 4 schematically shows an enlarged section 400 of the cell mesh 320 of the locator chips 110 and 300. The cell mesh 400 has a regular arrangement of square cells 420 in two-dimensions. In the example of FIG. 4, the dimensions of the cell 420 in the x-direction and the y-direction are called $d_x$ and $d_y$, respectively.

However, it is neither necessary that the cells 420 are rectangular or even square nor that the coordinates of the cell mesh 320 have Cartesian coordinates. Instead of Cartesian coordinates, polar coordinates can also be used in order to fix the location of a cell 420 within the cell mesh 320 or the section 400 of the cell mesh 320. In particular, this can be useful if a variation of the spatial resolution is required across the cell mesh 320 of the locator chips 110 and 300. Furthermore, it is not necessary that the individual cells 420 of the cell mesh 320 are rectangular, arbitrary polygons or round cells can also be used. Moreover, non-linear Cartesian co-ordinates can also be used.

The arrangement 500 of FIG. 5 illustrates one individual cell which is strongly magnified. In detail, FIG. 5 shows the cell 420 of the section 400 represented in FIG. 4 of the cell mesh 320 of the locator chips 110 and 300. In this exemplary cell mesh 320 each individual cell comprises four essential elements. The cell 420 has a reference point or an initial identification 510 which is a square arranged in the left lower corner in the example of FIG. 5. The reference point 510 represents the point of reference of the cell 420. In the exemplary cell 420, the directions of the x-axis and the y-axis are coded by a barcode 520, 530 in the surface of the locator chips 110 and 300 in the direction of the respective axis. Apart from the two different orientations the barcode 520, 530 comprises two different line thicknesses. In the exemplary cell 420 of FIG. 5, the barcode 520 for the x-axis has one thick line and two thin lines. On the other hand, the barcode 530 for the y-axis is coded by two thin lines. Further, the position of the middle line is unfilled.

The coding of the column number 540 and the row number 550 which indicates the position of the cell 420 or its coordinates 540, 550 within the cell mesh 320 are indicated above one another in the right upper half of the cell 420 of the cell mesh 320. As can be seen from FIG. 4, the lower number (288 in FIG. 5) indicates the row 550 of the cell 420 in the cell mesh 320 and the upper number (507 in FIG. 5) indicates the column 540 of the cell 320, 420 in the cell mesh 320. In the standard indicated in the lower end of the cell 420 a graduation mark characterizes a distance of 100 nm. Thus, the area of the cell 420 comprises 2.4 μm×2.4 μm, i.e. $d_x = d_y = 2.4$ μm.

The dimension of the smallest structural element is 80 nm and is used for the representation of the row number 550 and the column number 540 in the upper right partial area of the cell 420. The square of the initial identification 510 represented in FIG. 5 has a line thickness of essentially 160 nm, and thus has double the strength of the smallest dimension of the cell 420 of FIG. 5. The inner opening of the initial identification 510 or the reference square is essentially 400 nm. The reference point 510 of the cell 420 is used as a point of reference for the determination of the first measuring point 190 by the SEM 120 and the second measuring point 195 by the SPM 140. Thus, the cell mesh 320 allows the determination of the distance between the first measuring point 190 and the second measuring 195 with a preciseness of <0.5 μm.

The line thicknesses of the barcodes 520 and 530 are the threefold or the fourfold of the dimensions of the minimum structural elements of the cell 420.

It is possible that not each cell 420 has all four above described elements 510, 520, 530, 540, and 550. For example, each cell 410, 420 may have only the barcode 520, 530 for one direction and the neighboring cell contains the barcodes 530, 520 for the second direction. Moreover, not each cell 420 has to contain the code which characterizes the complete position of the cell within the cell mesh 320. Rather, it is sufficient if for example only each second or only each $n^{th}$ cell has the coordinates 540 and 550 as long as the evaluation unit of the computer system 185 knows the system of the coding of the locator chip 110, 300. For example, it can be useful to indicate in one cell 420 only the coordinate for the column 540 of the cell mesh 320 and to indicate in the neighboring cell the coordinate 550 of the cell mesh 320. On the one hand, this allows using larger numerical values for the position of the cell 420 in the cell mesh 320. Thus, also larger cell meshes 320 can be coded in a cell 420. On the other hand, also at a small cell size, a minimum size of a structural element can be selected for coding the information in the surface structure of the cell so that the structural elements can still be easily investigated.

In case that not each cell 420 comprises the entire information indicating the position of the cell 420 within the cell mesh, both the SBM 120 and the SPM 140 have to be capable to investigate within their field of view two or several neighboring cells in order to determine the position of the first measuring point 190 and the second measuring point 195 without any doubt.

FIG. 6 schematically represents the determination of the distance vector of the first measuring point 190 and the second measuring point 195 for the locator chip 300 of FIG. 3, i.e. the determination of the actual distance vector $\vec{R}_1$.

In the first step, the SBM 120 or in the example of FIG. 1 the SEM 120 scans a cell 410 of the cell mesh 320 of the locator chip 300. In the example represented in FIG. 6, the SEM 120 identifies the reference point 510, the barcodes 520, 530 of the cell 410 with the coordinates: row=287, column=504.

In the second step, the locator chip 300 is shifted by the expected distance vector (nominal distance) $\vec{R}_0$ between the first measuring point 190 and the second measuring point 195 of FIG. 1 by the sample stage 115. In the example of FIG. 6, the reference point 610 of the locator chip 300 has the coordinates: row=286 and column=508.

Alternatively, the arrangement comprising the SEM 120 and the SPM 140 can be shifted by the nominal distance vector $\vec{R}_0$, since only the relative shift vector between the locator chip 300 and the separation between the SEM 120 and the SPM 140 is of significance. The nominal distance vector $\vec{R}_0$ represents the distance between the first measuring point 190 and the second measuring point 195. Moreover, it is also possible to perform the shift $\vec{R}_0$ by a combined movement of the locator chip 300 and the SBM 120 (or SEM 120 in the example of FIG. 1) and the SPM 140.

In the third step of the example illustrated in FIG. 6, the SPM 140 scans the area of the locator chip 300 which is below the test prod 165 of the SPM 140. The sizes of the cells 410, 420 of the cell mesh 320 of the locator chip 300 are selected such that the SPM 140 easily scans the cells 410, 420 which are within its field of view. Since the field of view of the SPM 140 is generally smaller than the field of view of the SBM 120, it is thus guaranteed that both microscopes 120, 140 scan one entire cell 410 and/or 420. According to this requirement, it is useful to select the dimensions of the cells 410 and 420 in the range of 10 μm to approximately 1 μm. As it is illustrated in FIG. 5, the cells 410, 420 of the cell mesh 320 of the locator chip 300 having a cell size of 2.4 μm×2.4 μm fulfill this requirement.

In the example of FIG. 6, the SPM 140 determines the reference point 510, the barcodes 520 and 530 as well as the coordinates 540, 550 of the cell 420: row=288, column=504. The real distance vector (actual distance) $\vec{R}_1$ between the first measuring point 190 of the SEM 120 (or generally of the SBM 120) which is identical to the reference point 510 of the cell 410 and the second measuring point 195 of the SPM 140 which is identical to the reference point 510 of the cell 420 results from the equation:

$$\vec{R}_1 = \vec{R}_0 + \vec{r}_2 - \vec{r}_1 \tag{1}$$

wherein $\vec{r}_1$ denotes the distance vector between the reference point 510 of the cell 410 from the reference point 610 of the locator chip 300 and is given by:

$$\vec{r}_1 = (col_1 - col_{ref}) \cdot d_x \cdot e_x + (row_1 - row_{ref}) \cdot d_y \cdot e_y \tag{2}$$

wherein $col_1$ and $row_1$ indicates the column number and row number, respectively, of the cell 410 of the first measuring point 190, and $col_{ref}$ and $row_{ref}$ denotes the column number and row number, respectively, of the reference point 610 of the locator chip 300. Furthermore, $d_x$ denotes the dimension of the cell 410, 420 in the x-direction and $d_y$ denotes the dimension of the cell 410, 420 in the y-direction as it is specified in FIG. 4. Further, $e_x$ and $e_y$ are unit vectors directing in the x- and the y-direction, respectively. For the special case that the cell mesh 320 has square cells 410, 420, it is: $d_x = d_y$.

As it is indicated in FIG. 6, the distance vector $\vec{r}_2$ between the reference point 510 of the cell 420 and the reference point 610 of the locator chip 300 and the reference point of the cell 420 is given by:

$$\vec{r}_2 = (col_2 - col_{ref}) \cdot d_x \cdot e_x + (row_2 - row_{ref}) \cdot d_y \cdot e_y \tag{3}$$

wherein $col_2$ and $row_2$ denote the column number and row number, respectively, of the cell 420 of the second measuring point 195. In equation 1, the difference vector $\vec{r}_2 - \vec{r}_1$ can simply be indicated by the difference of the column number 540 and the line number 550 multiplied by the dimensions $d_x$ and $d_y$ of the cell 410, 420.

$$\vec{r}_2 - \vec{r}_1 = (col_2 - col_1) \cdot d_x \cdot e_x + (row_2 - row_1) \cdot d_y \cdot e_y \tag{4}$$

This means that equation 1 can generally be written in a form:

$$\vec{R}_1 = \vec{R}_0 + (col_2 - col_1) \cdot d_x \cdot e_x + (row_2 - row_1) \cdot d_y \cdot e_y \tag{5}$$

In the example represented in FIG. 6 this leads to:

$$\vec{R}_1 = \vec{R}_0 + (507 - 504) \cdot 2.4 \, \mu m \cdot e_x + (288 - 287) \cdot 2.4 \, \mu m \cdot e_y \tag{6}$$

For the locator chip 110 indicated in FIG. 3, the distance vector $\vec{R}_1$ between the first measuring point 190 and the second measuring point 195 is simply determined from the difference of the column number and the row number of the cell mesh 320 if its cells 410, 420 are serially numbered or from the distance vector $\vec{D}$ of the first cell mesh 320 with the reference number 370 and the second cell mesh 320 with the reference number 380:

$$\vec{R}_1 = \vec{D}_0 + (col_2 - col_1) \cdot d_x \cdot e_x + (row_2 - row_1) \cdot d_y \cdot e_y \tag{7}$$

By the separation of the operation areas of the scanning particle microscope and the at least one scanning probe microscope both tools can effectively use their specific performance. The usage of a locator chip enables simply and reproducibly shifting the sample back and forth between the operation areas of the two tools.

The invention claimed is:

1. A method comprising:
   using an exchange mask comprising a structure which simultaneously at least partially covers a measuring area of a scanning probe microscope and a field of view of a scanning particle microscope to determine a distance between a measuring point of the scanning probe microscope and an optical axis of the scanning particle microscope,
   wherein:
   the scanning particle microscope and the scanning probe microscope are spaced with respect to each other in a common vacuum chamber so that the distance between the optical axis of the scanning particle microscope and the measuring point of the scanning probe microscope in a direction perpendicular to the optical axis of the scanning particle microscope is larger than a maximum field of view of both the scanning probe microscope and the scanning particle microscope.

2. A method, comprising:
   determining a distance between a measuring point of a scanning probe microscope and an optical axis of a scanning particle microscope, wherein the scanning particle microscope and the scanning probe microscope are spaced with respect to each other in a common vacuum chamber so that the distance between the optical axis of the scanning particle microscope and the measuring point of the scanning probe microscope in a direction perpendicular to the optical axis of the scanning particle microscope is larger than a maximum field of view of both the scanning probe microscope and the scanning particle microscope; and exchanging the probe of the scanning probe microscope, and then automatically determining the distance between the measuring point of the scanning probe microscope and the optical axis of the scanning particle microscope.

3. The method of claim 2, comprising using an exchange mask to exchange the probe, wherein the exchange mask comprises a probe and a locator chip having a structure which simultaneously at least partially covers a measuring area of the scanning probe microscope and the field of view of the scanning particle microscope.

4. The method of claim 3, wherein the locater chip comprises mechanical and electrical components which manage the exchange of the probe.

5. The method of claim 3, wherein the locater chip comprises a microstructured cell mesh which can be measured by both the scanning particle microscope and the scanning probe microscope.

6. The method of claim 5, wherein the locater chip comprises coordinates for a respective cell of the cell mesh in at least one portion of the cells which are coded in a microstructured surface structure of the locater chip.

7. The method of claim 6, wherein the coordinates of the cells are numerically coded.

8. The method of claim 6, wherein the size of a cell of the cell mesh is smaller than the field of view of the scanning particle microscope and the scanning probe microscope.

9. The method of claim 6, wherein a size of a cell of the cell mesh is less than 10 µm.

10. The method of claim 6, wherein a smallest dimension of a structural element of a cell of the cell mesh is not smaller than 500 nm.

11. The method of claim 6, wherein:
determining the distance between the measuring point of the scanning probe microscope and the optical axis of the scanning particle microscope comprises determining a code of a first cell by the scanning particle microscope; and
determining the code of a second cell by the scanning probe microscope.

12. The method of claim 6, wherein a cell comprises:
a reference point;
a barcode to identify a first coordinate;
a barcode to identify a second coordinate; and
a specification of the first coordinate and/or a specification of the second coordinate.

13. The method of claim 6, comprising automatically determining the distance between the measuring point of the scanning probe microscope and the optical axis of the scanning particle microscope in regular intervals.

14. An apparatus, comprising:
a vacuum chamber;
a scanning particle microscope in the vacuum chamber;
a scanning probe microscope in the vacuum chamber; and
a control element,
wherein:
a distance between an optical axis of the scanning particle microscope and a measuring point of the scanning probe microscope in a direction perpendicular to the optical axis of the scanning particle microscope is larger than a maximum field of view of both the scanning probe microscope and the scanning particle microscope;

the control element is configured so that, during use of the apparatus, the control element automatically determines the distance between the measuring point of the scanning probe microscope and the optical axis of the scanning particle microscope via an exchange mask comprising a structure which simultaneously at least partially covers a measuring area of the scanning probe microscope and the field of view of the scanning particle microscope.

15. An apparatus, comprising:
a vacuum chamber;
a scanning particle microscope in the vacuum chamber;
a scanning probe microscope in the vacuum chamber;
a control element; and
an exchange mask configured to exchange the probe,
wherein:
a distance between an optical axis of the scanning particle microscope and a measuring point of the scanning probe microscope in a direction perpendicular to the optical axis of the scanning particle microscope is larger than a maximum field of view of both the scanning probe microscope and the scanning particle microscope;
the control element is configured to automatically determine the distance between the measuring point of the scanning probe microscope and the optical axis of the scanning particle microscope; and
the exchange mask comprises at least one exchange probe and a locater chip having a structure which simultaneously at least partially covers a respective measurement range of the scanning probe microscope and the field of view of the scanning particle microscope.

16. The apparatus of claim 15, wherein the locater chip comprises mechanical and electrical components managing the change of the probe.

17. The apparatus of claim 15, wherein the locater chip comprises a microstructured cell mesh which is measurable by the scanning particle microscope and the scanning probe microscope.

18. The apparatus of claim 17, wherein the locater chip comprises coordinates for the respective cell of the cell mesh in at least one portion of the cells, which are coded in a microstructured surface structure of the locater chip.

19. A locater chip, comprising:
a cell mesh having a microstructured surface structure in which information is coded which can be determined by both a scanning particle microscope and the a scanning probe microscope,
wherein:
the locater chip is configured to determine a distance between a measuring point of the scanning particle microscope and a measuring point of the scanning probe microscope; and
a portion of the cells of the cell mesh comprises a coordinate for a respective cell which is coded in a microstructured surface structure of the locater chip.

20. The locater chip of claim 19, wherein the coordinates of the cells are numerically coded.

21. The locater chip of claim 19, wherein a size of a cell of the cell mesh is less than the field of view of the scanning particle microscope and the field of view of the scanning probe microscope.

22. The locater chip of claim 19, wherein a size of a cell of the cell mesh is less than 10 μm.

23. The locater chip of claim 19, wherein a smallest dimension of a structural element of a cell of the cell mesh is not less than 500 nm.

24. The locater chip of claim 19, wherein a cell comprises:
a reference point;
a barcode to identify a first coordinate;
a barcode to identify a second coordinate; and
a specification of a numerical value for the first coordinate and the second coordinate.

25. The locater chip of claim 24, wherein the cell mesh comprises rectangular cells capable of being periodically arranged, the reference point comprises an initial identification, and the first coordinate comprises an x-axis and the second coordinate comprises an y-axis.

* * * * *

UNITED STATES PATENT AND TRADEMARK OFFICE
CERTIFICATE OF CORRECTION

| | | |
|---|---|---|
| PATENT NO. | : 9,115,981 B2 | Page 1 of 1 |
| APPLICATION NO. | : 14/038148 | |
| DATED | : August 25, 2015 | |
| INVENTOR(S) | : Christof Baur et al. | |

It is certified that error appears in the above-identified patent and that said Letters Patent is hereby corrected as shown below:

In the specification

Col. 1, line 3, below title, insert

-- Cross-Reference to Related Applications

The present application is a continuation of, and claims benefit under 35 USC 120 to, international application PCT/EP2012/002276, filed May 25, 2012, which claims priority under 35 USC 119(e) to U.S. Provisional Application No. 61/491,713, filed May 31, 2011. The entire disclosure of international application PCT/EP2012/002276 is incorporated by reference herein. --.

In the claims

Col. 18, line 52, Claim 19, after "the", delete "a".

Signed and Sealed this
Sixteenth Day of February, 2016

Michelle K. Lee
*Director of the United States Patent and Trademark Office*